US006266003B1

(12) United States Patent
Hoek

(10) Patent No.: US 6,266,003 B1
(45) Date of Patent: Jul. 24, 2001

(54) METHOD AND APPARATUS FOR SIGNAL PROCESSING FOR TIME-SCALE AND/OR PITCH MODIFICATION OF AUDIO SIGNALS

(75) Inventor: Steven Marcus Jason Hoek, Auckland (NZ)

(73) Assignee: Sigma Audio Research Limited, Auckland (NZ)

( * ) Notice: Subject to any disclaimer, the term of this patent is extended or adjusted under 35 U.S.C. 154(b) by 0 days.

(21) Appl. No.: 09/264,794

(22) Filed: Mar. 9, 1999

(30) Foreign Application Priority Data

Aug. 28, 1998 (NZ) ..................................................... 331639

(51) Int. Cl.[7] ..................................................... H03M 2/12

(52) U.S. Cl. .................................. 341/155; 381/36; 395/2

(58) Field of Search ..................................... 704/205, 203, 704/229, 222; 341/155; 375/254; 381/36; 395/2

(56) References Cited

U.S. PATENT DOCUMENTS 5,297,236 * 3/1994 Antill et al. ............................. 395/2
5,394,473 * 2/1995 Davidson .............................. 381/36

* cited by examiner

*Primary Examiner*—Brian Young
*Assistant Examiner*—John Nguyen
(74) *Attorney, Agent, or Firm*—Skadden, Arps, Slate, Meagher & Flom LLP

(57) ABSTRACT

Method and apparatus for encoding and manipulating digital signals are provided. The method, and associated apparatus, includes sampling the signal waveform to obtain a series of discrete samples and constructing therefrom a series of frames; multiplying each frame with a windowing function; applying a Fast Fourier transform to each frame producing a frequency-domain waveform; convoluting the resultant frequency domain data with a variable kernel function; locating local maxima and surrounding minima in the magnitude spectrum of each convolved frame, each local maxima and associated minima defining a plurality of regions corresponding to a frequency component of the signal; and analyzing each of the regions in the frequency domain representation by summing the complex frequency components of bins falling within the defined regions into a single vector. The variable kernel function may be varied with frequency to achieve a differing tradeoff between frequency and temporal resolution across the range of the signal.

26 Claims, 5 Drawing Sheets

From FIG. 1A

METHOD AND APPARATUS FOR SIGNAL PROCESSING FOR TIME-SCALE AND/OR PITCH MODIFICATION OF AUDIO SIGNALS

FIELD OF THE INVENTION

The present invention relates to encoding and manipulation of digital signals. More particularly, although not exclusively, the present invention relates to time-scale and/or pitch modification of audio signals. As such, the signal analysis and re-synthesis method described herein is not limited to audio signals. It is envisaged that the present invention may find application in the coding of other signals with the (wavelet-like) method described herein. An example of such an application includes image compression. Essentially the present invention may be applied where one wishes to simultaneously analyze different regions of the frequency domain with differing temporal/spatial resolutions.

BACKGROUND TO THE INVENTION

There are a number of existing techniques for time-scale/pitch modification of audio signals which are known in the art. These can be broadly classified as follows.

(a) Time domain methods:

These techniques attempt to estimate the fundamental period of a musical signal by detecting periodic activity in the audio signal. By this process, an input signal is delayed and multiplied by the undelayed signal, the product of which is then smoothed in a low pass filter to provide an approximate measure of the auto-correlation function. The autocorrelation function is then used to detect a nonperiodic signal or a weak periodic signal which might be hidden in the noise. Once the fundamental period of the musical signal is found the process is repeated and the analyzed sections of the signal are overlapped. A significant disadvantage in these techniques is that most audio signals do not have a fundamental period. For example polyphonic instruments, recordings with reverberation and percussion sounds do not have an identifiable fundamental period. Further, when applying such methods, transients in the music are repeated. This leads to notes having multiple starts and ends. Another problem with this technique is that overlapping of the delayed sections of the music can produce an audio effect which is metallic, mechanical or exhibits echo-like nature.

(b) Sinusoidal analysis methods:

These techniques assume that the input signal is made up from pure sinusoids. The inherent disadvantage of such a method is therefore self evident.

Sinusoidal analysis techniques use Short Time Fast Fourier Transforms (FFT) to estimate the frequency of the component sinusoids. The derived signal is then synthesized with a bank of tone generators to produce the desired output. Short Time Fourier Analysis captures information about the frequency content of a signal within a time interval, governed by the Window Function chosen. A significant disadvantage of such techniques is that a single time-domain window is applied to all the frequency content of the signal, so the signal analysis cannot correspond accurately to human perception of the signal content. Also, conventional sinusoidal analysis methods use a local maxima search of the magnitude spectrum to determine the frequency of the constituent sinusoids including consideration of relative phase changes between analysis frames. This technique ignores any side-band information located around each of the local maxima. The effect of this is to exclude any signal modulation occurring within a single analysis frame, resulting in a smearing of the sound and almost a complete loss of transients. An example of such a transient, in the audio context, is a guitar pluck.

(c) Phase vocoder methods:

This type of technique uses a Fast Fourier Transform as a large bank of filters and treats the output of each of the filters separately. The relative phase change between two consecutive analyses of the input are used to estimate the frequency of the signal content within each bin. A resulting frequency-domain signal is synthesized from this information, treating each bin as a separate signal. In contrast to sinusoidal analysis techniques, this method retains the spectral energy distribution of the original signal. However, it destroys the relative phase of any transient information. Therefore, the resulting sound is smeared and echo-like.

In view of the prior art techniques, it would therefore be desirable to analyze and process audio signals so that the resultant output retains the tonal characteristics of the original signal and is capable of accurately capturing transient sounds without smearing or introducing an echo-like character to the output signal.

Accordingly, it is an object of the present invention to provide a technique for processing audio signals which achieves the abovementioned aims and ameliorates at least some of the disadvantages inherent in the prior art or at least provides the public with a useful choice. Further, it is an object of the invention to provide a signal analysis and synthesis method which can also be applied to the coding of signals in general.

SUMMARY OF THE INVENTION

In one aspect the invention provides for a method of encoding and re-synthesizing a waveform, the method including:

- sampling the waveform to obtain a series of discrete samples and constructing therefrom a series of frames, each frame spanning a plurality of samples;
- multiplying each frame with a windowing, preferably raised cosine, function wherein the peak of the windowing function is centered substantially at a zero point of each frame;
- applying a Fast Fourier Transform to each frame thereby producing a frequency-domain waveform;
- convoluting the resultant frequency domain data with a variable kernel function, whose specification varies with frequency;
- locating local maxima and surrounding minima in the magnitude spectrum of each convolved frame, wherein each local maxima and associated minima define a plurality of regions, each region corresponding to a frequency component of the signal; and
- analyzing each of the regions in the frequency domain representation separately by summing the complex frequency components of bins falling within the defined region into a signal vector, wherein the variable kernel function can be usefully varied to achieve a differing tradeoff between frequency and temporal resolution across the frequency range of the signal.

In a preferred embodiment, the waveform corresponds to a digitized audio frequency waveform wherein the kernel function may be varied to approximate the perceptual characteristics of the human ear.

In the case where the waveform corresponds to an audio signal, the location of the maxima corresponds to the perceived pitch of the frequency component.

The method may further include the step of manipulating the signal while represented as signal vectors.

Such manipulation may take the form of modifying pitch or time scale (in an audio signal) or further data reduction adapted for efficient signal storage and/or transmission.

In the case of modifying an audio signal, the frequency location and phase of analyzed signal vectors can be shifted as necessary to achieve a scaling of time and/or pitch.

Converting back to the sampled time domain representation of the signal may be achieved by accumulating into the frequency domain an equivalent signal whose components correspond to those signal vectors determined in the analysis of the original signal.

Preferably an Inverse Fast Fourier Transform may be applied so as to give a time domain signal that may be suitably windowed and accumulated to produce the decoded signal.

Preferably the form of the convolution function is determined empirically by subjectively assessing the quality of the synthesized output.

Preferably the application of the kernel function to the frequency domain data is implemented as a single-pole low-pass filter operation on said data, the pole's location being varied with frequency.

Preferably, in the case of the analysis of audio signals, the pole may be specified by a control function s(f) of the form:

$$s(f)=0.4+0.26\ arctan(4ln(0.1f)—18)$$

where f is the frequency in hertz (cycles per second).

The frequency domain filter may be specified by the relation:

$$y_{out}(f)=[1-s(f)]y_{in}(f)+s(f)y_{out}(f-1)$$

Preferably, for the purposes of manipulating an audio signal, each signal vector is treated separately; for pitch shifting the frequency of the component is multiplied by a real-valued pitch factor; for both pitch shift and time scale modification the necessary phase shift for glitch free reconstruction is calculated and applied.

Preferably the method includes the further steps of:

- zeroing a frequency domain output array, and for each analyzed frequency component represented as an analyzed signal vector;
- mapping the real-valued frequency to the two nearest integer-valued frequency bins; and
- distributing the analyzed signal vector between the two bins in proportion to 1 minus the real-valued frequency and the respective bins' locations.

In a further aspect, the invention provides for software adapted to perform the abovementioned method.

In a further aspect, the invention provides for hardware adapted to perform the abovementioned method.

BRIEF DESCRIPTION OF THE DRAWINGS

The invention will now be described by way of example only and with reference to the drawings in which.

DETAILED DESCRIPTION OF THE INVENTION

Figure 1A:
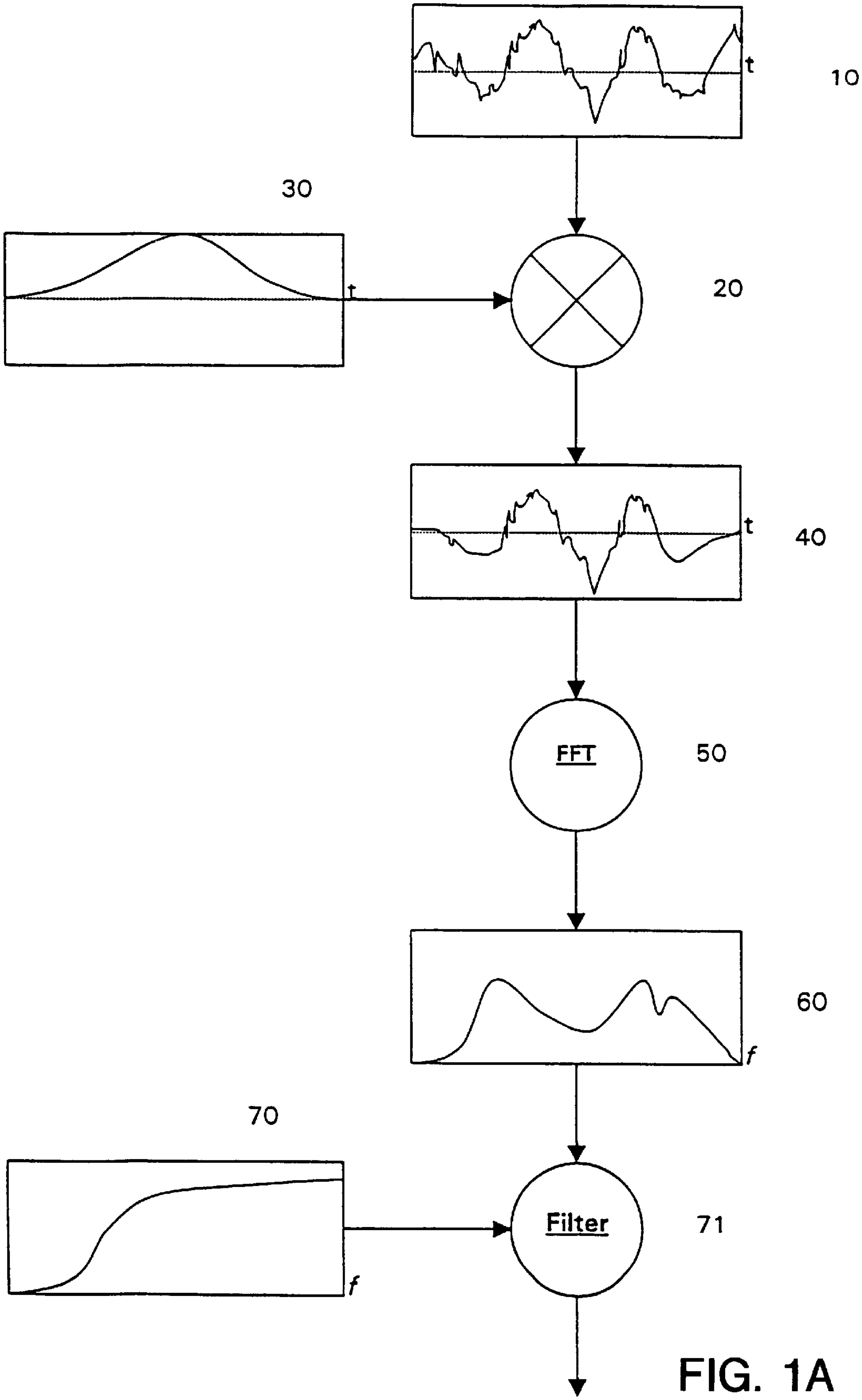
FIGS. 1A, 1B and 1C illustrate a simplified schematic block diagram of an embodiment of the method of the invention.
Figure 1B:
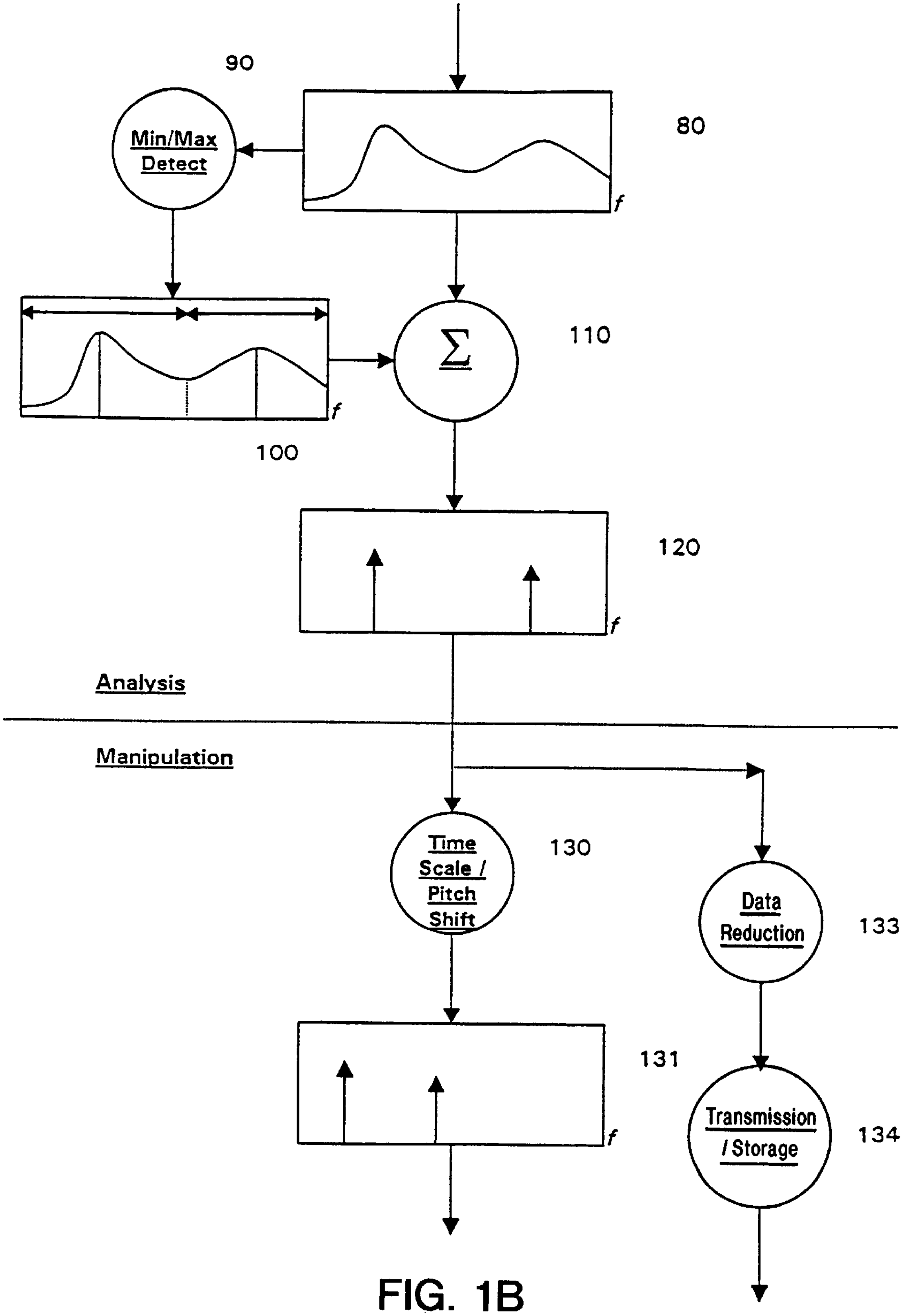
Figure 1C:
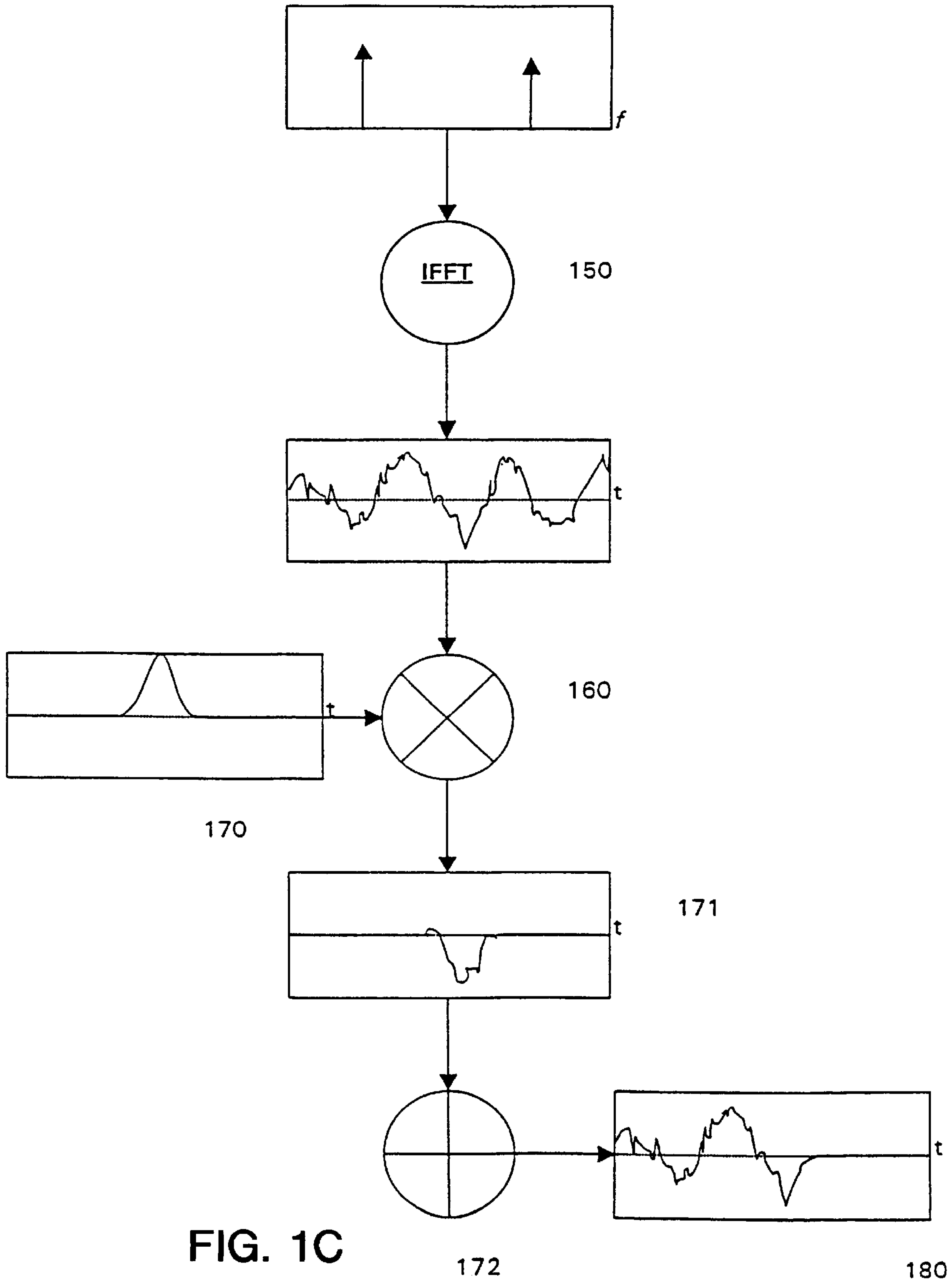

Referring to FIGS. 1A–1C, a simplified flowchart illustrates the overall steps in an embodiment of the method of signal processing. For clarity, the schematic is split over FIGS. 1A–1C.

An input audio signal is digitized into frames 10. Each of these frames is then processed as follows:

Each frame 10 is windowed 20 with for example a wide cosine function 30 producing time domain modulated representation of the input signal frame 10. A Fast Fourier Transform 50 is then applied to each frame 10 producing a frequency domain representation of the input signal 60.

The frequency domain representation of data is then filtered with a filtering function 71 parameterised by s(f)70. The filtering function may also be viewed as a low-pass single pole filter in the present example. The function s(f) 70 specifies how the behaviour of the filter varies with frequency. The filtering function 71 can be described by the recursive relation:

$$y_{out}(f)=[1-s(f)]y_{in}(f)+s(f)y_{out}(f-1)$$

Thus s(f) 70 controls the 'severity' of the filter 71. So in effect, a different convolution kernel is used for each frequency bin. The real and imaginary components of each bin are convolved separately. In the present exemplary embodiment, the filtering or convolution function 71 has the effect of "blurring" the frequency domain information and therefore the convolving function 71 can be referred to as a blurring function. Blurring or spreading the frequency domain data corresponds to a narrowing of the equivalent window in the time domain frame. Therefore each frequency bin of the fast Fourier Transform is effectively calculated as if a different sized time domain window had been applied before the FFT operation.

The effect of the filter 71 does not have to be to blur the data. For example, translating the time domain samples by half the window size would make it necessary to high-pass filter the frequency domain data, to achieve the same equivalent windowing in the time domain.

The frequency domain filter 71 is applied to each bin in ascending order and then applied in descending order of frequency bin. This is to ensure that no phase shift is introduced into the frequency domain data.

A key aspect of the present invention is that the control function s(f) is chosen, in the case of processing audio frequency data, so as to approximate the excitation response of human cilia located on the basilar membrane in the human ear. In effect, the function s(f) is chosen so as to approximate the time/frequency response of the human ear.

The form of the control function s(f) is, in the present preferred embodiment, determined empirically by gauging the quality of the output or synthesized waveform under varying circumstances. Although this is a subjective procedure, repeated and varied evaluations of the quality of the synthesised sound have been found to produce a highly satisfactory convolution function.

A preferred form of the control function s(f) is:

$$s(f)=0.4+0.26arctan(4ln(0.1f)-18)$$

where f is the frequency in hertz (cycles per second).

In effect, the aforementioned steps are analogous to an efficient way to process a signal through a large bank of filters where the bandwidth of each filter is individually controllable by the control function s(f).

Once the filter 71 is applied, the convolved frequency domain data 80 is analyzed (90) to determine the locations of local maxima and the associated local minima.

To perform this step, it has been found that it is more efficient to use the intensity spectrum. Therefore, for each frequency, the data is a local maximum if $I(f)>I(f-1)$ and $I(f)>I(f+1)$. Local minima exist if $I(f)<I(f-1)$ and $I(f)<I(f+1)$. Here, $Mag(f)=\sqrt{real(f)^2+im(f)^2}$ and $Intensity(f)=real(f)^2+im(f)^2$.

Figure 2:
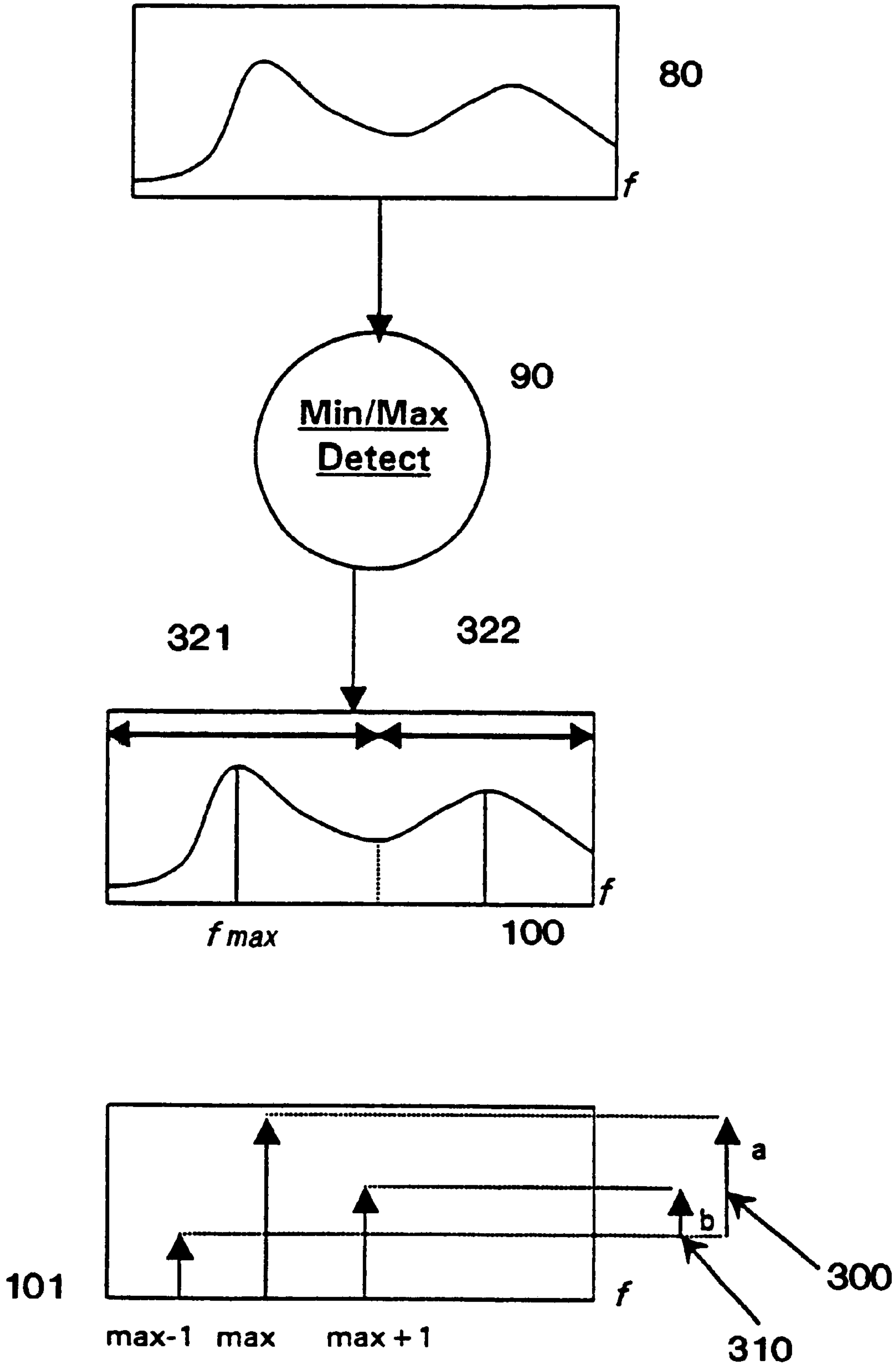
FIG. 2 illustrates a schematic diagram of the process of searching for the maxima/minima.

Referring to FIG. 2, each maxima and associated local minima is used to define regions 321, 322 (indicated by arrows in FIG. 2) which correspond to an audible harmonic in the original audio frequency signal. The location of the maxima in the frequency domain corresponds to the perceived pitch of the harmonic and the band of the frequency domain information around the maxima represents any associated amplitude or frequency modulations of that harmonic. Since it is important not to lose this information, a summation of the whole band of frequencies around the peak is used to give a signal vector. This way the temporal resolution of the analysis sample will match the bandwidth of any modulations taking place.

Each of the regions is processed separately accordingly to the following technique. An accurate estimate of the location of each maxima is determined. Referring to FIG. 2, lower graph 101 the large arrow a (300) is the difference between the smallest intensity of the three intensity arrows (max−1) and the maximum intensity (max). The small arrow b (310) is the difference between the smallest (max−1) and the intermediate intensity (mas+1). The ratio of the two is used to offset the integer maximum value.

Pitch shifting and time-scale modification are indicated schematically in FIG. 1 by the numeral 130. At this point alternative applications are indicated by data reduction 133 or transmission/storage 134 steps. These are illustrated as alternative options in FIG. 1B.

The manipulated data are re-synthesized according to the following method: For the ith analyzed frequency component, vector(i) has a real-valued location y in the frequency domain output. y is rounded down to the nearest integer which is less than or equal to y and denoted z. Thus z=Int(y).

The output bins z and z+1 are then added to with vector(i), in proportion to 1 minus the difference between y and that bins integer location.

$$Bin[z]=Bin[z]+[1-(y-z)]vector(i)$$

$$Bin[z+1]=Bin[z+1]+(y-z)vector(i)$$

where all operations are carried out on complex numbers.

To modify the time-scale or pitch of the analyzed signal, it is necessary to compensate for any phase shifts so that the synthesized output is consistent (i.e. glitch free). To this end, the output signal in any one frame is moved forward in time by a fixed number of samples. Therefore, for a given pitch measurement it is possible to determine how much the output phase should change so that that the output smoothly joins with the previously synthesized frame.

However, the input time frame is moving by some other number of samples. Therefore, the analyzed phase values are already changing as the analysis window moves through the input data.

Therefore the difference between the rate of change of input phase and the required rate of change of output phase is calculated. The difference between these phases is a measure of how fast to rotate the phase of the frequency domain data between analysis and synthesis. Each of the signal vectors defined above has a frequency measurement. This measurement is used to calculate how quickly to spin a vector of magnitude 1, where the vector is a complex number of representation. This vector is multiplied by the signal vector to provide the necessary phase shift for synthesis without affecting the timing of the decay characteristics or other modulations for each region.

This phase shift (in radians) is given by:

$$phase(i) = \frac{(2\pi f[t_r - t_a])}{t_w}$$

Where $t_r$=reconstruction time step in samples, $t_a$=analysis time step in samples and $t_w$=FFT size in samples.

Since the measurement of frequency provides a measure of phase difference between one synthesis frame and the next, these differences must be summed cumulatively as synthesis proceeds.

The cumulative sum applies only to one region, therefore regions must be tracked from one synthesis frame to the next.

Figure 3A:
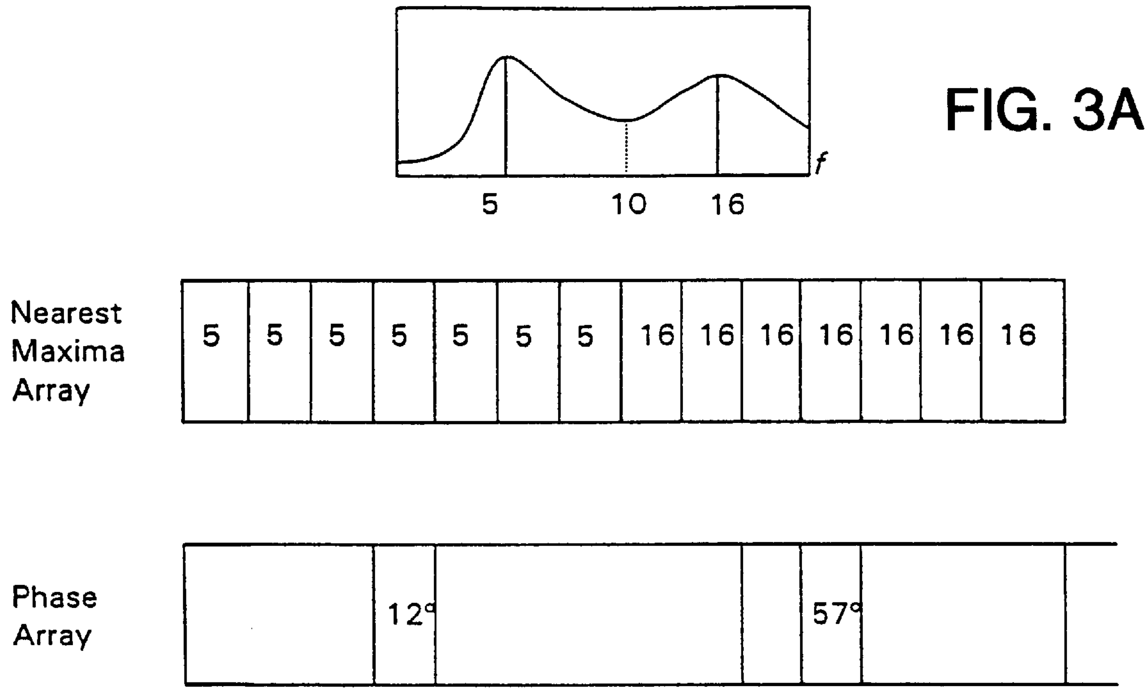
FIGS. 3*a* and 3*b* illustrate pitch and time stretching in respect of two maxima.
Figure 3B:
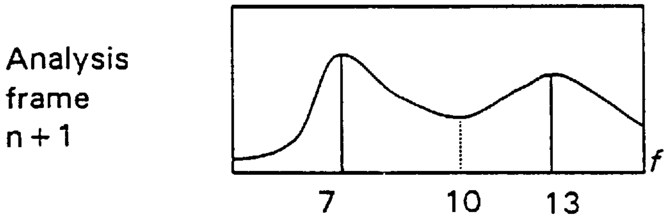

A convenient data structure has been developed to track regions from one frame to the next and is described with reference to FIGS. 3*a* and 3*b*. One integer array contains the location of the local maximum within a region for all the bins in that region. A corresponding array contains the last phase value (in radians) used to rotate that regions phase. The phase value is stored in the bin with the same index as the location of the maximum.

Therefore, when a new frame is analyzed and local maxima detected, the location of the maximum is used to index into the integer array. This provides the index of the maximum that existed in the previous frame. This index is then used to access the array containing the last phase value used for the corresponding region in the previous synthesis frame. This is illustrated in FIGS. 3*a* and *b* whereby an analysis frame n is illustrated along with the nearest maxima array and the phase array. Considering the n+1 analysis frame, the first frequency maxima is 7. The corresponding seventh element of the nearest maxima array from the previous frame is 5. The fifth element of the phase array frame from the previous frame n is 12 degrees. This is updated using an estimate of the local maxima and then stored in the phase array for the next frame using position 7. For the second region 410 the thirteenth element of the nearest maxima array from the previous analysis frame n gives 16. From the phase array of the previous analysis frame n the phase is given as 57 degrees. A frequency estimate is used to update this phase value and is placed in the position 13 of the next phase array.

A frequency domain representation of the signal 120 is constructed from the known signal components. For each signal vector, that vector is added to the frequency domain output array. Since the frequency locations are real valued the energy from a signal vector is distributed between the nearest two (integer valued) bin locations. The frequency domain representation 120 is then inverse Fourier transformed (150 in FIG. 1 page 16) to provide a time domain representation 132 of the synthesized signal. Since the signal was analyzed with differing temporal resolutions at different frequencies, the synthesised time domain signal 132 is only valid in the region equivalent to the highest temporal analysis resolution used. To this end, the synthesized time domain signal 132 is windowed (160) with a (relatively) small positive cosine window (170), before being added (172) in an overlapping fashion to the final synthesized signal (180).

There exist variations in the implementation of this technique which will be clear to one skilled in the art. However, the key feature of the present invention resides in using a control function s(f) to vary a frequency domain filter at different frequencies. This brings about a windowing effect on the equivalent time-domain data that varies with frequency. In the case of processing audio frequency signals, this control function is chosen to reflect the response of the human cilia to a range of audio frequencies.

Although the shape of this curve is determined empirically, it is possible that other curves may prove suitable for other manipulative techniques and applications.

A further feature of the present invention resides in the identification and location of the maxima and associated minima. The presently disclosed technique is computationally highly efficient and allows rapid time stretching, pitch shifting etc.

Experimentally, it has been shown that the present technique produces a sound with significantly enhanced tonal qualities and it is believed that this is largely achieved through the preservation of the harmonic information in the side-bands of the local frequency maxima.

In terms of a practical implementation of the present invention, it is envisaged that the technique may be implemented in software or alternatively in hardware. In the latter case, the hardware may form part of an audio component such as an audio player. Potential applications of the invention include the sound recording industry where audio signal processing/synthesis is commonly required to meet very high standards of reproduction quality. Alternative applications include those in the entertainment industry and it is anticipated that the technique may find application in sound reproduction/transmission systems where variations in pitch or tempo may be desirable. It is further anticipated that applications may exist in general signal processing, data reduction and/or data transmission and storage. In the latter case, the selection of the particular convolution function may vary.

Where in the foregoing description reference has been made to elements or integers having known equivalents, then such equivalents are included as if they were individually set forth.

Although the invention has been described by way of example and with reference to particular embodiments, it is to be understood that modifications and/or improvements may be made without departing from the scope of the appended claims.

What is claimed is:

1. A method of encoding a signal having a plurality of frequency components, said method comprising:

- sampling the signal to obtain a series of discrete samples and constructing therefrom a series of frames, each frame spanning a plurality of samples;
- multiplying each frame with a windowing function having a peak, wherein the peak of the windowing function is centered substantially at a zero point of each frame;
- applying a frequency transform to each frame, said transform producing a corresponding frequency-domain waveform;
- convoluting the resultant frequency-domain wave-form with a variable kernel function, the specification of the variable kernel function varying with frequency;
- locating local maxima and surrounding minima in the magnitude spectrum of each convolved waveform, each said local maxima and associated minima define a plurality of regions, each region corresponding to a frequency component of the signal; and
- analyzing each of the regions in the frequency domain waveform separately by summing the complex frequency components falling within the defined region into a signal vector; wherein the variable kernel function can be usefully varied to achieve a differing tradeoff between frequency and temporal resolution across the frequency range of the signal.

2. The method of claim 1, wherein the windowing function is a raised cosine function.

3. The method of claim 1, wherein the sampled signal corresponds to a digitized audio frequency waveform and wherein the kernel function is varied to approximate the perceptual characteristics of the human ear.

4. The method of claim 1, wherein the sampled signal corresponds to an audio signal, and the location of the maxima corresponds to the perceived pitch of the frequency component.

5. The method of claim 1, further comprising manipulating the signal while represented as signal vectors.

6. The method of claim 5, wherein said manipulating takes the form of modifying pitch.

7. The method of claim 1, wherein the frequency location and phase of analyzed signal vectors are shifted according to a predetermined amount to achieve a scaling of time.

8. The method of claim 1 further compromising the step of resynthesizing said signal, said re-synthesis compromising:

- accumulating into the frequency domain an equivalent signal whose components correspond to those signal vectors determined in the analysis of the original signal.

9. The method of claim 1 further compromising the step of re-synthesizing said signal, said re-synthesis compromising:

- applying an Inverse Fast Fourier Transform to the signal so as to produce a time domain signal that may be suitably windowed and accumulated to produce the decoded signal.

10. The method of claim 1, wherein the form of the kernel function is determined empirically by subjectively assessing the quality of the synthesised output.

11. The method of claim 1 wherein the application of the kernel function to the frequency domain data is implemented as a single-pole low-pass filter operation on said data, the pole's location being varied with frequency.

12. The method of claim 11, wherein the pole is specified by a control function s(f) of the form:

$$s(f)=0.4+0.26\ arctan(4ln(0.1f)-18)$$

where f is the frequency in hertz (cycles per second).

13. The method of claim 1, wherein the frequency domain filter may be specified by the relation:

$$y_{out}(f)=[1-s(f)]y_{in}(f)+s(f)y_{out}(f-1).$$

14. The method of claim 1, wherein each signal vector is treated separately.

15. The method of claim 1, further comprising:

- zeroing a frequency domain output array, and for each analyzed frequency component represented as an analyzed signal vector; mapping the real-valued frequency to the two nearest integer-valued frequency bins; and
- distributing the analyzed signal vector between the two bins in proportion to 1 minus the real-valued frequency and the respective bin's locations.

16. A computer-readable medium having stored thereon a plurality of instructions which, when executed by a processor in a computer system, cause the processor to perform the steps of:

- sampling a signal to obtain a series of discrete samples and constructing therefrom a series of frames, each frame spanning a plurality of samples;
- multiplying each frame with a windowing function wherein the peak of the windowing function is centered substantially at a zero point of each frame;

applying a frequency transform to each frame thereby producing a frequency-domain waveform;

convoluting the resultant frequency-domain waveform with a variable kernel function, the specification of the variable kernel function varying with frequency;

locating local maxima and surrounding minima in the magnitude spectrum of each convolved waveform, wherein each local maxima and associated minima define a plurality of regions, each region corresponding to a frequency component of the signal; and analyzing each of the regions in the frequency domain waveform separately by summing the complex frequency components falling within the defined region into a signal vector; wherein the variable kernel function can be usefully varied to achieve a differing tradeoff between frequency and temporal resolution across the frequency range of the signal.

17. A system for encoding a signal, comprising:

a sampling module to sample said signal to obtain a series of discrete samples and to construct therefrom a series of frames, each frame spanning a plurality of samples, the sampling module further multiplying each frame with a windowing function wherein the peak of the windowing function is centered substantially at a zero point of each frame;

a transform module to apply a frequency transform to said frame thereby producing a frequency-domain waveform;

a convolution module to convolute said frequency-domain waveform with a variable kernel function, the specification of the variable kernel function varying with frequency; and an analysis module, the analysis module locating local maxima and surrounding minima in the magnitude spectrum of each convolved waveform, wherein each local maxima and associated minima define a plurality of regions, each region corresponding to a frequency component of the signal, the analysis module further analyzing each of the regions in the frequency domain waveform separately by summing the complex frequency components falling within the defined region into a signal vector;

wherein the variable kernel function can be usefully varied to achieve a differing tradeoff between frequency and temporal resolution across the frequency range of the signal.

18. A system for encoding a signal, comprising:

sampling means for sampling said signal to obtain a series of discrete samples and to construct therefrom a series of frames;

transform means for applying a frequency transform to said frames to produce a frequency-domain waveform;

convolution means for convoluting said frequency-domain waveform to produce convolved waveforms; and analysis means for locating local maxima and surrounding maxima in said convolved waveforms.

19. The method of claim 5, wherein said manipulating takes the form of modifying time scale.

20. The method of claim 5, wherein said manipulating takes the form of further data reduction adapted for efficient signal transmission.

21. The method of claim 5, wherein said manipulating takes the form of further data reduction adapted for efficient signal storage.

22. The method of claim 1, wherein the frequency location and phase of analyzed signal vectors are shifted according to a predetermined amount to achieve a scaling of pitch.

23. The method of claim 1, wherein the frequency location and phase of analyzed signal vectors are shifted according to a predetermined amount to achieve a scaling of time and pitch.

24. The method of claim 1, wherein the frequency of the component is multiplied by a real-valued pitch factor for pitch shifting the signal.

25. The method of claim 1, wherein the necessary phase shift for glitch free reconstruction is calculated and applied to the signal for both pitch shift and time scale modification.

26. The method of claim 1, wherein the frequency transform is a Fast Fourier Transform.

* * * * *